(12) United States Patent
Chen

(10) Patent No.: US 10,938,394 B2
(45) Date of Patent: Mar. 2, 2021

(54) PHASE-LOCKED LOOP CIRCUIT

(71) Applicant: REALTEK SEMICONDUCTOR CORP., Hsinchu (TW)

(72) Inventor: Chien-Wen Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/808,559

(22) Filed: Mar. 4, 2020

(65) Prior Publication Data

US 2021/0021271 A1    Jan. 21, 2021

(30) Foreign Application Priority Data

Jul. 17, 2019  (TW) .................................. 108125286

(51) Int. Cl.
*H03L 7/07*  (2006.01)
*H03L 7/097*  (2006.01)

(52) U.S. Cl.
CPC ............... *H03L 7/07* (2013.01); *H03L 7/097* (2013.01)

(58) Field of Classification Search
CPC . H03L 7/07; H03L 7/08; H03L 7/0805; H03L 7/081; H03L 7/0812; H03L 7/0816; H03L 7/085; H03L 7/087; H03L 7/089; H03L 7/091; H03L 7/095; H03L 7/097; H03L 7/16; H03L 7/18
See application file for complete search history.

(56) References Cited

U.S. PATENT DOCUMENTS

| 5,332,978 | A * | 7/1994 | Yabuki ...................... G06F 7/62 331/11 |
| 9,520,889 | B2 * | 12/2016 | Unruh ................... H03L 7/1974 |
| 10,651,858 | B2 * | 5/2020 | Ott .......................... H03L 7/089 |

OTHER PUBLICATIONS

Kenta Sogo; Akihiro Toya; Takamaro Kikkawa. "A Ring-VCO-Based Sub-Sampling PLL CMOS Circuit with—119 dBclHz Phase Noise and 0/3 ps Jitter," 2012 IEEE.
Xiang Gao; Eric A. M. Klumperink; Gerard Socci; Mounir Bohsali; Bram Nauta. "Spur Reduction Techniques for Phase-Locked Loops Exploiting a Sub-Sampling Phase Detector," IEEE Journal of Solid-State Circuits, vol. 45, No. 9, Sep. 2010.

* cited by examiner

*Primary Examiner* — Diana J. Cheng
(74) *Attorney, Agent, or Firm* — Li & Cai Intellectual Property (USA) Office

(57) ABSTRACT

A motor driving device includes a first hysteresis comparator, a second hysteresis comparator, a logic circuit, a control unit, and an inverter circuit. The logic circuit receives a start signal or a start completion signal to output the first output signal as a commutation signal according to the start signal, or to output the second output signal as the commutation signal according to the start completion signal, clamps the second output signal by the first output signal, stops outputting the commutation signal after the potential state of the commutation signal is changed, and unclamps the second output signal with the first output signal and outputs the commutation signal in response to a difference voltage between the first input signal and the second input signal being greater than a positive value of the first hysteresis voltage or less than a negative value of the first hysteresis voltage.

15 Claims, 5 Drawing Sheets

PHASE-LOCKED LOOP CIRCUIT

CROSS-REFERENCE TO RELATED PATENT APPLICATION

This application claims the benefit of priority to Taiwan Patent Application No. 108125286, filed on Jul. 17, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a phase-locked loop circuit, and more particularly to a phase-adjusted circuit having a phase adjustment circuit capable of operating in a duty cycle adjustment mode and a delayed phase-locked loop mode, and a phase frequency detection circuit capable of accurately controlling a predetermined dead time.

BACKGROUND OF THE DISCLOSURE

A phase-locked loop (PLL) is a frequency and phase synchronization technique implemented by feedback control principle, which synchronizes a clock output from a circuit with an external reference clock. When a frequency or a phase of the reference clock changes, the phase-locked loop detects the change and adjusts an output frequency through an internal feedback system until the two are resynchronized. The synchronization is also called being "phase-locked".

In a conventional PLL, since an N-divider is set on a feedback path, noise of a phase detector (PD) and a charge pump (CP) is multiplied by $N^2$ after being output by a voltage-controlled oscillator (VCO). The factor dominates phase noise of the PLL and limits jitter-power factor (FOM) of the PLL. Therefore, a sub-sampling phase-locked loop (SSPLL) has been developed. A phase detector is used in the SSPLL to sub-sample an output of a high frequency VCO with a reference clock. Since the frequency divider is omitted on the feedback path, the noise of the PD and CP in the PLL will not be multiplied by $N^2$ and will be greatly attenuated due to a high phase detection gain, resulting in lower phase noise and better jitter-power factor of the PLL.

However, the above circuits merely have a single function and cannot be operated in different modes for different applications. Therefore, there is a need to improve the circuit design to improve circuit performances for different applications to overcome the above drawbacks.

SUMMARY OF THE DISCLOSURE

In response to the above-referenced technical inadequacies, the present disclosure provides a phase-locked loop circuit, which has a phase adjustment circuit capable of operating in a duty cycle adjustment mode and a delayed phase-locked loop mode, and a phase frequency detection circuit capable of accurately controlling a predetermined dead time.

In one aspect, the present disclosure provides a phase-locked loop circuit includes a delay phase-locked loop and a sub-sampling phase-locked loop. The delay phase-locked loop phase is configured to lock a first reference clock and a second reference clock to an input clock, and includes a phase correction circuit, a first sub-sampling phase detector, and a first charge pump. The phase correction circuit is configured to adjust the input clock according to a first control signal or a second control signal, and generate the first reference clock and the second reference clock. The integrator is configured to generate the first control signal. The first sub-sampling phase detection circuit is configured to sample an output clock with the second reference clock to generate the second control signal. The sub-sampling phase-locked loop is configured to generate the output clock with a predetermined phase-locked loop frequency, and the output clock is phase-locked to the first reference signal. The sub-sampling phase-locked loop includes a second sub-sampling phase detection circuit, a phase frequency detection circuit, a voltage-controlled oscillator, and a first frequency divider. The second sub-sampling phase detecting circuit is configured to sample the output clock with the first reference clock and output a third control signal. and The phase frequency detecting circuit is configured to receive the first output clock and a frequency-dividing signal, and when a phase error between the first output clock and the frequency-dividing signal is greater than a predetermined dead time, the phase detecting circuit generates a fourth control signal. The voltage-controlled oscillator is configured to generate the output clock based on the third control signal and the fourth control signal. The first frequency divider is configured to frequency divide the output clock to generate the frequency-dividing signal. The phase correction circuit is configured to operate in a duty cycle adjustment mode and a delayed phase-locked loop mode. In the duty cycle adjustment mode, the integrator is configured to generate the first control signal according to the first reference clock and the second reference clock, and the phase correction circuit is configured to adjust the input clock according to the first control signal to generate the first reference clock and the second reference clock. In the delay phase-locked loop mode, the phase correction circuit is configured to adjust the input clock according to the second control signal to generate the first reference clock and the second reference clock.

Therefore, the phase-locked loop circuit provided by the present disclosure has a phase adjustment circuit capable of operating in a duty cycle adjustment mode and a delayed phase-locked loop mode, and the phase adjustment circuit can be used as a frequency multiplier in the duty cycle adjustment mode with a lower amount of jitter. The phase adjustment circuit can also be used as a phase delay in the sub-sampling phase-locked loop in the delay phase-locked loop mode, thereby making the phase-locked loop (PLL) circuit have a lower spur.

Further, the phase-locked loop circuit provided by the present disclosure has a phase frequency detection circuit capable of precisely controlling the predetermined dead time. More accurate phase difference information and the predetermined dead time can be generated by forming similar paths having the same delay circuits.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
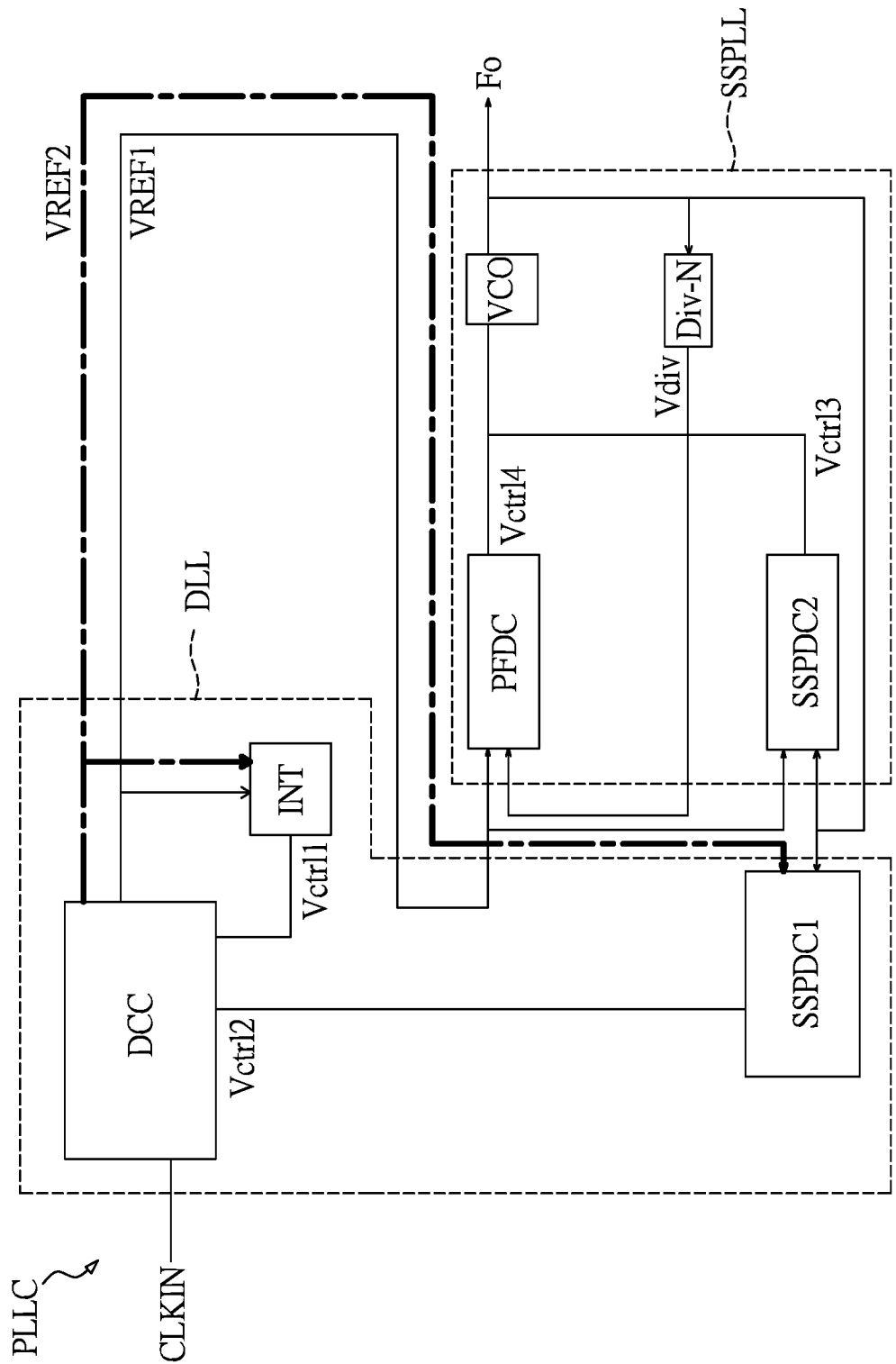
FIG. 1 is a block diagram of a phase-locked loop circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a phase-locked loop circuit according to an embodiment of the present disclosure. As shown in FIG. 1, an embodiment of the present disclosure provides a phase-locked loop circuit PLLC including a delay phase-locked loop DLL and a subsampling phase-locked loop SSPLL. The delay phase-locked loop DLL synchronizes a first reference clock VREF1 and a second reference clock VREF2 with an external input clock CLKIN by using a feedback control principle, in other words, the first reference clock VREF1 and the second reference clock VREF2 are phase-locked to the input clock CLKIN, thereby achieving frequency and phase synchronization.

As shown in FIG. 1, the delay phase-locked loop DLL includes a phase correction circuit DCC, an integrator INT, and a first sub-sampling phase detection circuit SSPDC1.

The phase correction circuit DCC is configured to adjust the input clock CLKIN according to a first control signal Vctrl1 or a second control signal Vctrl2, and generate the first reference clock VREF1 and the second reference clock VREF2. Further reference can be made to FIG. 2, which shows a detailed circuit diagram of one embodiment of the phase-locked loop circuit of the present disclosure.

Figure 2:
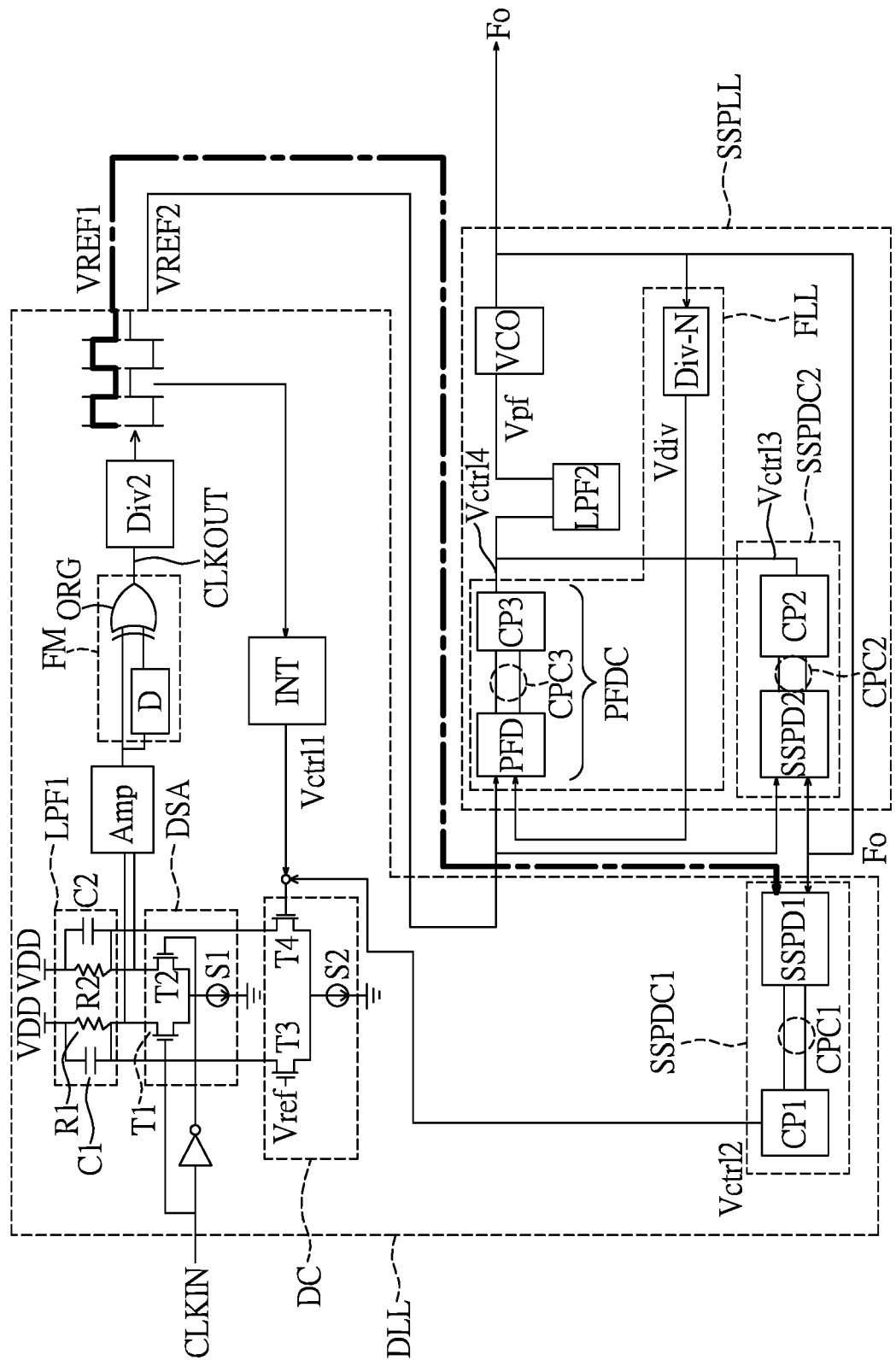
FIG. 2 is a detailed circuit diagram of one embodiment of the phase-locked loop circuit of the present disclosure.

As shown in FIG. 2, the phase correction circuit DCC includes a first low-pass filter LPF1, a DC control circuit DC, a DC offset amplifier DSA, an amplifier Amp, a frequency multiplication circuit FM, and a second frequency divider Div2.

The first low-pass filter LPF1 is used to filter the input clock CLKIN to generate a first filtered signal. The DC control circuit DC is used to adjust a DC voltage according to the first control signal Vctrl1. The DC offset amplifier DSA is coupled to the first low-pass filter LPF1 and the DC control circuit DC, and includes two transistors T1, T2 and a current source S1, which are used to generate an intermediate clock based on the first filtered signal and the DC voltage. In the present embodiment, a gate of the transistor T1 receives the input clock CLKIN, the intermediate clock is output through a drain of the transistor T1, and a source of the transistor T1 is coupled to the ground through the current source S1. A gate of another transistor T2 receives an inverted signal (generated by the inverter) of the input clock CLKIN, the intermediate clock is output through the drain of this transistor T2, and the source of this transistor T2 is coupled to the ground through a current source S2.

The first low-pass filter LPF1 includes a capacitor C1 and a resistor R1 connected in parallel, and a capacitor C2 and a resistor R2 connected in parallel. One end of the capacitor C1 is coupled to the drain of the transistor T1, and the other end of the capacitor C1 is coupled to the system voltage signal VDD. One end of the resistor R1 is coupled to the drain of the transistor T1, and the other end of the resistor R1 is coupled to a system voltage signal VDD. One end of the capacitor C2 is coupled to the drain of the transistor T2, and the other end of the capacitor C2 is coupled to the system voltage signal VDD. One end of the resistor R2 is coupled to the drain of the transistor T2, and the other end of the resistor R2 is coupled to the system voltage signal VDD.

The DC control circuit DC includes a transistor T3, a transistor T4, and the current source S2. A gate of the transistor T3 receives a reference signal Vref (e.g., a constant voltage), a drain of the transistor T3 is coupled to the drain of the transistor T1, and a source of the transistor T3 is coupled to the ground through the current source S2. A gate of the transistor T4 receives the first control signal Vctrl1, a drain of the transistor T4 is coupled to the drain of the transistor T3, and a source of the transistor T4 is coupled to the ground through the current source S2.

The input clock CLKIN and the inverted signal thereof are amplified by the transistor T1 and the transistor T2, respectively, and the amplified input clock CLKIN and the amplified inverted signal are filtered by the first low-pass filter circuit LPF1. The filtered-amplified signal (i.e., the intermediate clock) is output by the drain of the transistor T1 and the drain of the transistor T2. A DC level of the drain of the transistor T1 and a DC level of the drain of the transistor T2 are controlled by a DC control circuit DC. A DC level of the intermediate clock can be adjusted separately by adjusting the reference signal Vref and the first control signal Vctrl1.

The amplifier Amp is coupled to the DC offset amplifier DSA, and is used to amplify the intermediate clock to generate the amplified intermediate clock. The frequency multiplier circuit FM is configured to adjust a frequency of the amplified intermediate clock to generate a frequency-multiplied signal CLKOUT. The second frequency divider Div2 is configured to divide the frequency-multiplied signal CLKOUT to generate the first reference clock VREF1 and the second reference clock VREF2. A frequency of the output clock signal is twice the input clock CLKIN after being adjusted by the frequency multiplication circuit FM (including the XOR gate ORG and the delay circuit D), but a duty ratio of the output clock signal is still maintained at a target value. In this case, the frequency divider Div2 divides the frequency-multiplied signal CLKOUT output from the frequency-multiplier circuit FM, so that frequencies of the generated first reference clock VREF1 and the second reference clock VREF2 are the same as the frequency of the input clock CLKIN. Therefore, the phase correction circuit DCC of FIG. 2 can be used as a frequency multiplier circuit.

The integrator INT is configured to generate the first control signal Vctrl1 according to the first reference clock VREF1 and the second reference clock VREF2, the circuit details of which will be described in detail hereinafter.

Figure 3:
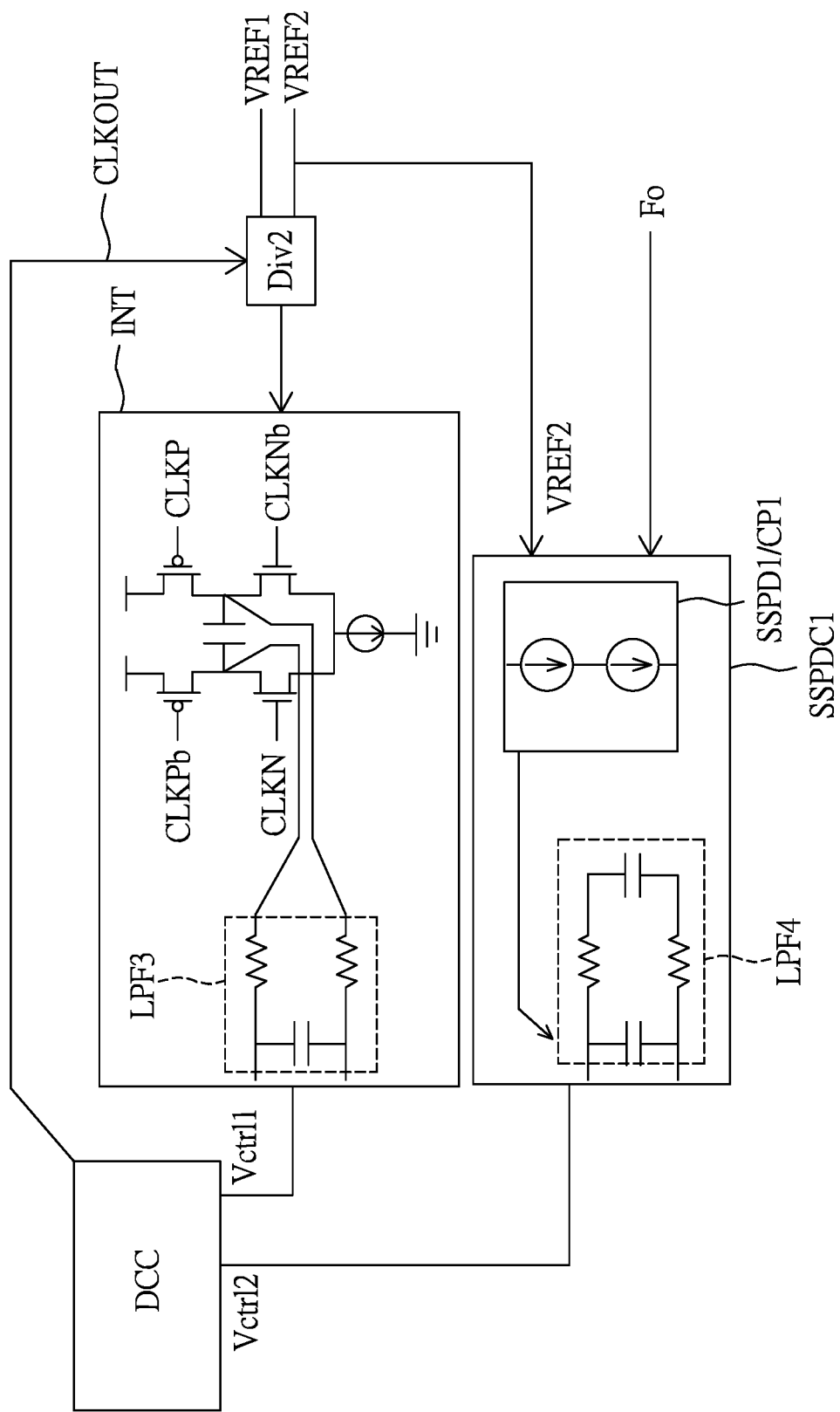
FIG. 3 is a circuit architecture diagram of a delay-locked circuit operated in a duty cycle adjustment mode and a delay-locked loop mode according to an embodiment of the present disclosure.

Further, reference is made to FIG. 3, which is a circuit architecture diagram of a delay-locked circuit operated in a duty cycle adjustment mode and a delay-locked loop mode according to an embodiment of the present disclosure. As shown in FIGS. 2 and 3, the integrator INT is coupled to the DC offset amplifier DSA and the DC control circuit DC, and configured to generate the first control signal Vctrl1 according to the first reference clock VREF1 and the second reference clock VREF2. In the present embodiment, the first control signal Vctrl1 is varied along with an average component of duty ratios of the first reference clock VREF2 and the second reference clock VREF2.

In detail, when the delay-locked circuit DLL enters the duty cycle adjustment mode, the integrator INT receives duty ratio reference signals CLKP, CLKPb, CLKN, and CLKNb generated according to the duty ratio difference between the first reference clock VREF1 and the second reference clock VREF2, respectively. Signals generated by the duty ratio reference signals CLKP, CLKPb, CLKN, and CLKNb are then filtered by a third low-pass filter circuit LPF3 to generate a first control signal Vctrl1.

For example, the integrator INT can reduce (or increase) a voltage level of the first control signal Vctrl1 when a relative duty ratio of the first reference clock VREF1 and the second reference clock VREF2 is greater than (or less than) a target value (for example, 50%). Alternatively, when the relative duty ratio of the first reference clock VREF1 and the second reference clock VREF2 are greater than (or less than) the target value, the voltage level of the first control signal Vctrl1 is increased (or decreased). The changes in the first control signal Vctrl1 reflect changes in the duty ratios of the first reference clock VREF1 and the second reference clock VREF2. Therefore, the integrator INT can be used as a frequency multiplier in a duty cycle adjustment mode, and make the phase-locked loop have a lower amount of jitter.

On the other hand, the first sub-sampling phase detection circuit SSPDC1 is coupled to the phase correction circuit DCC and samples an output clock Fo with the second reference clock VREF2 to generate the second control signal Vctrl2. As shown in FIG. 2, the first sub-sampling phase detection circuit SSPDC1 includes a first sub-sampling phase detector SSPD1 and a first charge pump CP1.

The first sub-sampling phase detector SSPD1 receives the second reference clock VREF2 and the output clock Fo, and is configured to sample the output clock Fo with the second reference clock VREF2 and convert a phase error between the second reference clock VREF2 and the output clock Fo to output a first charge pump control signal pair CPC1. The first charge pump CP1 generates a second control signal Vctrl2 according to the first charge pump control signal pair CPC1.

Further referring to FIG. 3, in the first sub-sampling phase detection circuit SSPDC1, the control signal generated through the first sub-sampling phase detector SSPD1 and the first charge pump CP1 can be filtered by a fourth low-pass filter LPF4 to generate a second control signal Vctrl2. The purpose is to add a sub-sampling delay-locked loop (SSDLL) on the sub-sampling phase-locked loop SSPLL, and while the SSDLL uses the same sub-sampling phase detection circuit as the sub-sampling phase-locked loop SSPLL, a sampling clock used is an inversion of the first reference clock VREF1, that is, the second reference clock VREF2. Therefore, the sub-sampling phase-locked loop SSPLL samples the output clock Fo of a voltage-controlled oscillator VCO by using rising edges, such that the rising edges of the second reference clock VREF2 (that is, falling edges of the first reference clock VREF1) can be aligned with zero crossing points of the output clock Fo. Therefore, in a delay-locked loop mode, the sub-sampling delay-locked loop SSDLL can be used as a phase retarder in the sub-sampling phase-locked loop SSPLL and have a lower spur.

Referring back to FIG. 1, the sub-sampling phase-locked loop SSPLL is configured to generate the output clock Fo with a predetermined phase-locked loop frequency, and the output clock Fo is phase-locked to the first reference signal VREF1. Specifically, the sub-sampling phase-locked loop SSPLL includes a second sub-sampling phase detection circuit SSPDC2, a phase frequency detection circuit PFDC, a voltage-controlled oscillator VCO, and a first frequency divider Div-N.

The second sub-sampling phase detection circuit SSPDC2 is configured to sample the output clock Fo with the first reference clock VREF1 and output a third control signal Vctrl3.

The phase frequency detecting circuit PFDC is configured to receive the first reference clock VREF1 and a frequency-dividing signal Vdiv, and when a phase error between the first reference clock VREF1 and the frequency-dividing signal Vdiv is greater than a predetermined dead time, the phase detecting circuit PFDC generates a fourth control signal Vctrl4.

The voltage-controlled oscillator VCO generates the output clock Fo according to the third control signal Vctrl3 and the fourth control signal Vctrl4. The first frequency divider Div-N is configured to frequency divide the output clock Fo to generate the frequency-dividing signal Vdiv.

On the other hand, when the phase error between the first reference clock VREF1 and the output clock Fo output from the voltage-controlled oscillator VCO is small, the phase frequency detecting circuit PFDC detects that the phase error is smaller than the predetermined dead time, and thus the output thereof goes to zero. In other words, the voltage-controlled oscillator VCO is mainly controlled by the fourth control signal Vctrl4 until the output clock Fo is close to being locked, and the third control signal Vctrl3 is used to control the voltage-controlled oscillator VCO when the output clock Fo in a locked state. Therefore, in the locked state, the sub-sampling phase-locked loop SSPLL does not have a frequency divider on the feedback path, thus eliminating the noise generated by the frequency divider and the power thereof. Hence the sub-sampling phase-locked loop SSPLL can achieve very low phase noise.

Further details of the sub-sampling phase-locked loop SSPLL are described hereinafter. As shown in FIG. 3, the second sub-sampling phase detection circuit SSPDC2 includes a second sub-sampling phase detector SSPD2 and a second charge pump CP2. The second sub-sampling phase detector SSPD2 is configured to sample the output clock Fo with the first reference clock VREF1, convert a phase error between the first reference clock VREF1 and the output clock Fo and output a second charge pump control signal pair CPC2. The second charge pump CP2 is configured to generate the third control signal Vctrl3 according to the second charge pump control signal pair CPC2.

On the other hand, as shown in FIG. 2, the phase frequency detection circuit PFDC includes a phase frequency detector PFD and a third charge pump CP3.

The phase frequency detector PFD receives the first reference clock VREF1 and the frequency-dividing signal Vdiv. When the phase error between the first output clock VREF1 and the frequency-dividing signal Vdiv is greater than a predetermined dead time, the phase frequency detector PFD generates a third charge pump control signal pair CPC3. The third charge pump CP3 is configured to generate a fourth control signal Vctrl4 according to the third charge pump control signal pair CPC3.

Furthermore, as shown in FIG. 2, the sub-sampling phase-locked loop SSPLL further includes a low-pass filter LPF for filtering the third control signal Vctrl3 and the fourth control signal Vctrl4 to generate a second filtered signal Vpf, and the voltage-controlled oscillator VCO generates the output clock Fo according to the second filtered signal Vpf. In this way, the second sub-sampling phase detector SSPD2 and the second charge pump CP2 sample the output clock Fo of the voltage-controlled oscillator VCO, but cannot distinguish the frequency of the first reference clock VREF1 with N-th power from other harmonics of the frequency. Therefore, the sub-sampling phase-locked loop SSPLL may be erroneously locked to an unwanted frequency division ratio, thus a frequency-locked loop FLL is needed for accurately locking the frequency. Here, the frequency-locked loop FLL includes a phase frequency detecting circuit PFDC and a first frequency divider Div-N.

It should be noted that the voltage-controlled oscillator VCO can be a ring oscillator (Ring VCO), which has a large adjustment gain, and therefore, a small variation in the control signal will cause a large variation in the output clock Fo output from the voltage-controlled oscillator VCO. Therefore, it is necessary to provide a frequency-locked loop FLL with a precisely predetermined dead time for the sub-sampling phase-locked loop SSPLL to operate when the output clock Fo is farther away from a frequency-locked state.

Figure 4:
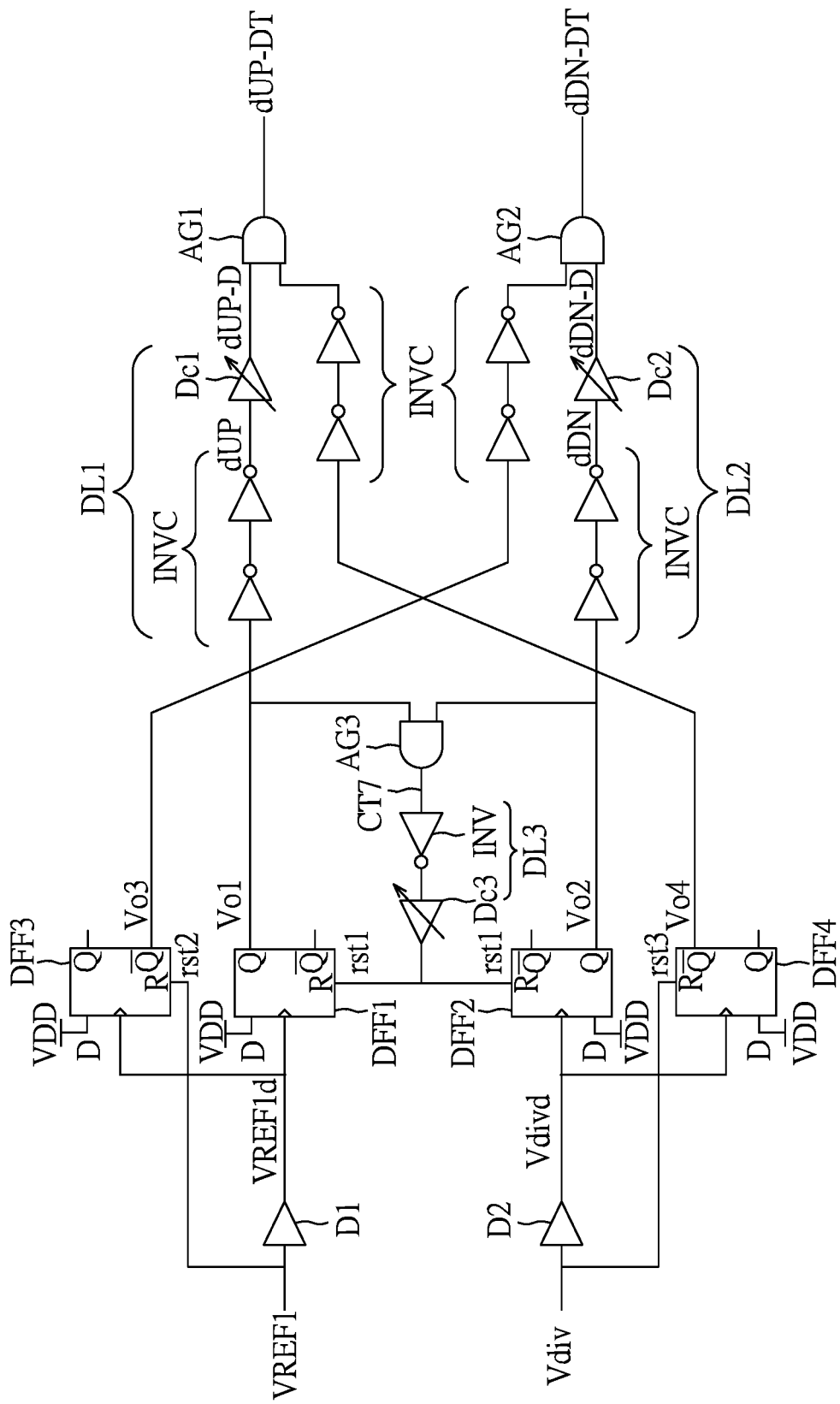
FIG. 4 is a detailed circuit diagram of a phase frequency detector with accurate predetermined dead time according to an embodiment of the present disclosure.
Figure 5:
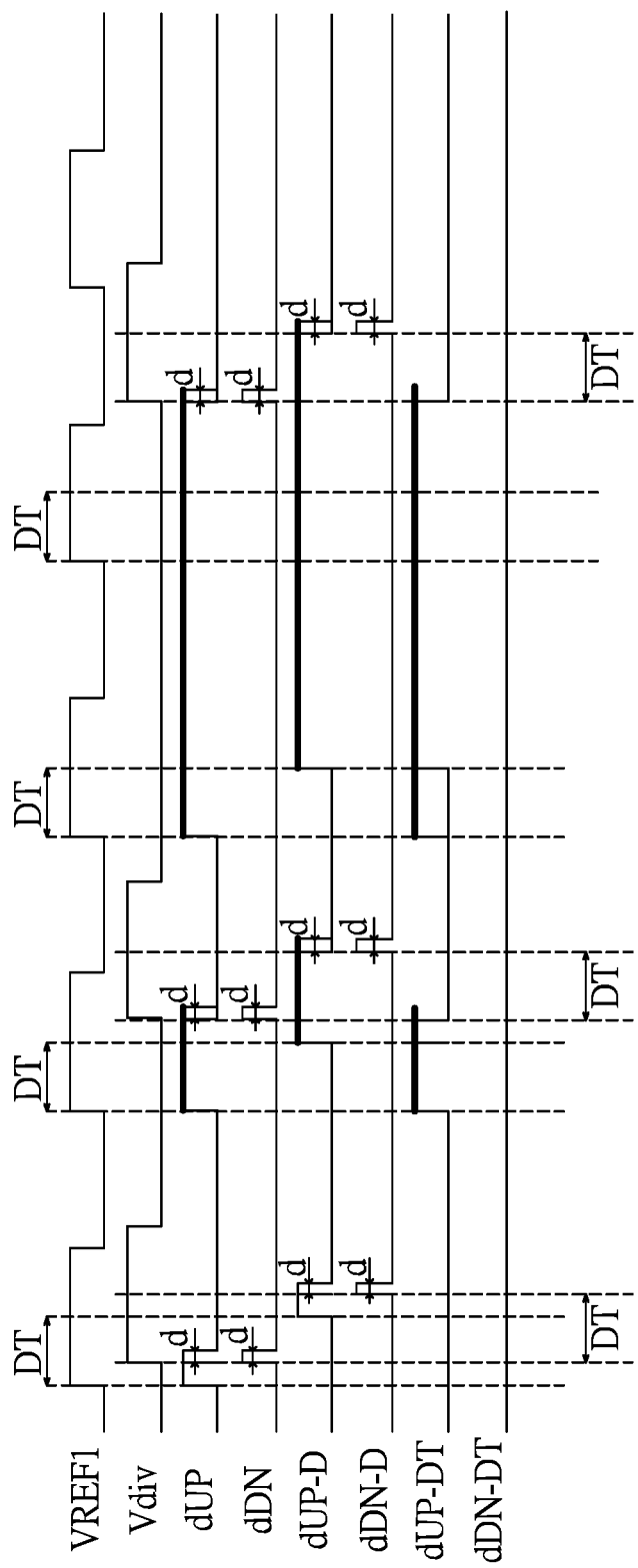
FIG. 5 is a signal timing diagram of a phase frequency detector with an accurate predetermined dead time according to an embodiment of the present disclosure.

Reference is further made to FIGS. 4 and 5, which are a detailed circuit diagram and a signal timing diagram of a phase frequency detector with an accurate predetermined dead time according to an embodiment of the present disclosure. As shown, the phase frequency detector PFD includes a plurality of flip-flops, a plurality of delay circuits, and logic gates. In detail, the phase frequency detector PFD includes a first flip-flop DFF1, a second flip-flop DFF2, a third flip-flop DFF3, a fourth flip-flop DFF4, a first delay circuit DL1, a second delay circuit DL2, a first logic gate and a second logic gate.

A clock terminal of the first flip-flop DFF1 receives the first delay signal VREF1d associated with the first reference clock VREF1, an input terminal D thereof receives the system voltage signal VDD, and a reset terminal R thereof receives the first reset signal rst1, so as to output a first output signal Vo1 from an output terminal Q thereof. The phase frequency detector PFD further includes a first delay element D1 that delays the first reference clock VREF1 to generate a first delay signal VREF1d.

A clock terminal of the second flip-flop DFF2 receives the first delay signal VREF1d associated with the frequency-divided signal Vdiv, an input terminal D thereof receives the system voltage signal VDD, and a reset terminal R thereof receives the first reset signal rst1, so as to output a second output signal Vo2 from an output terminal Q thereof. The phase frequency detector PFD further includes a second delay element D2 that delays the frequency-divided signal Vdiv to generate a second delayed signal Vdivd.

A clock terminal of the third flip-flop DFF3 receives the first delay signal VREF1d, an input terminal D thereof receives the system voltage signal VDD, and a reset terminal R thereof receives the second reset signal rst1, so as to output a third output signal Vo3 from a output terminal Q thereof. In this case, the second reset signal rst2 is the first reference clock VREF1.

The fourth flip-flop DFF4 receives the second delayed signal Vdivd, the system voltage signal VDD, and the third reset signal rst3 to output a fourth output signal Vo4 at an output terminal Q thereof. In this case, the third reset signal rst3 is a frequency-divided signal Vdiv.

The first delay circuit DL1 can include an inverter circuit INVC and an adjustable delay unit (serving as a dead time cell) Dc1, an inverted signal dUP is output by inputting the first output signal Vo1 to the inverter circuit INVC, and a third delay signal dUP-D can be generated by using the adjustable delay unit Dc1 to delay the inverted signal dUP by a predetermined dead time DT. The inverter circuit INVC includes two inverters, and thus a waveform of the inverter signal dUP is the same as that of the first output signal Vo1.

The second delay circuit DL2 can include another inverter circuit INVC and an adjustable delay unit (serving as a dead time cell) Dc2, an inverted signal dDN is output by inputting the second output signal Vo2 to the inverter circuit INVC, and a fourth delay signal dDN-D can be generated by using the adjustable delay unit Dc2 to delay the inverted signal dDN by the predetermined dead time DT. The inverter circuit INVC includes two inverters, and thus a waveform of the inverter signal dDN is the same as that of the second output signal Vo2. In addition, the third output signal Vo3 and the fourth output signal Vo4 also pass through an inverter circuit INVC including two inverters while maintaining the same waveforms.

The first logic gate can be, for example, a first AND gate AG1, which receives the third output signal Vo3 and the third delay signal dUP-D and performs a logical operation (AND operation) to generate a fifth control signal dUP-DT. The second logic gate may be, for example, a second AND gate AG2, which receives the fourth output signal Vo4 and the fourth delay signal dDN-D and performs logical operations to generate a sixth control signal dDN-DT.

Here, the fifth control signal dUP-DT and the sixth control signal dDN-DT serve as the third charge pump control signal pair CPC3.

Furthermore, the phase frequency detector PFD further includes a third logic gate and a third delay circuit DL3, and the third logic gate can be, for example, a third AND gate AG3, which receives the first output signal Vo1 and the second output signal Vo2 and performs logical operations (AND operation) to generate a seventh control signal CT7. The third delay circuit DL3 includes a third adjustable delay unit Dc3, which delays the seventh control signal CT7 by the predetermined dead time DT, and performs inversion processing by the inverter INV to generate the first reset signal rst1. It should be noted that the first delay circuit DL1, the second delay circuit DL2, and the third delay circuit DL3 use same delay units, such as the adjustable delay units Dc1, Dc2, and Dc3.

In detail, when the phase error between the first output clock VREF1 and the frequency-divided signal Vdiv is not within a range of the predetermined dead time DT, the first and second AND gates AG1 and AG2 will output pulses of the fifth control signal dUP-DT and the sixth control signal dDN-DT generated by the phase frequency detector PFD, respectively. When the phase error is within the range of the predetermined dead time DT, the first and second AND gates AG1 and AG2 will not output the pulses of the fifth control signal dUP-DT and the sixth control signal dDN-DT.

In addition, the phase frequency detection circuit PFD can generate more accurate phase difference information and the predetermined dead time DT by forming similar paths having the same delay circuits.

In conclusion, the phase-locked loop circuit provided by the present disclosure has a phase adjustment circuit capable of operating in a duty cycle adjustment mode and a delayed phase-locked loop mode, and the phase adjustment circuit can be used as a frequency multiplier in the duty cycle adjustment mode with a lower amount of jitter. The phase adjustment circuit can also be used as a phase delay in the sub-sampling phase-locked loop in the delay phase-locked loop mode, thereby making the phase-locked loop circuit have a lower spur.

Further, the phase-locked loop circuit provided by the present disclosure has a phase frequency detection circuit capable of precisely controlling the predetermined dead time. More accurate phase difference information and the predetermined dead time can be generated by forming similar paths having the same delay circuits.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A phase-locked loop circuit comprising:
   a delay phase-locked loop configured to lock a first reference clock and a second reference clock to an input clock, including:
      a phase correction circuit configured to adjust the input clock according to a first control signal or a second control signal, and generate the first reference clock and the second reference clock;
      an integrator configured to generate the first control signal; and
      a first sub-sampling phase detection circuit configured to sample an output clock with the second reference clock to generate the second control signal; and
   a sub-sampling phase-locked loop configured to generate the output clock with a predetermined phase-locked loop frequency, wherein the output clock is phase-locked to the first reference signal, wherein the sub-sampling phase-locked loop includes:
      a second sub-sampling phase detecting circuit configured to sample the output clock with the first reference clock and output a third control signal; and
      a phase frequency detecting circuit configured to receive the first reference clock and a frequency-dividing signal, wherein when a phase error between the first reference clock and the frequency-dividing signal is greater than a predetermined dead time, the phase detecting circuit generates a fourth control signal;
      a voltage-controlled oscillator configured to generate the output clock based on the third control signal and the fourth control signal; and
      a first frequency divider configured to frequency divide the output clock to generate the frequency-dividing signal,
   wherein the phase correction circuit is configured to operate in a duty cycle adjustment mode and a delay phase-locked loop mode,
   wherein in the duty cycle adjustment mode, the integrator is configured to generate the first control signal according to the first reference clock and the second reference clock, and the phase correction circuit is configured to adjust the input clock according to the first control signal to generate the first reference clock and the second reference clock;
   wherein in the delay phase-locked loop mode, the phase correction circuit is configured to adjust the input clock according to the second control signal to generate the first reference clock and the second reference clock.

2. The phase-locked loop circuit according to claim 1, wherein the phase correction circuit further includes:
   a first low pass filter configured to filter the input clock to generate a first filtered signal;
   a DC control circuit configured to adjust a DC voltage according to a first control signal;
   a DC offset amplifier, coupled to the first low-pass filter and the DC control circuit and configured to generate an intermediate clock according to the first filtered signal and the DC voltage;
   an amplifier coupled to the DC offset amplifier and configured to amplify the intermediate clock to generate an amplified intermediate clock;
   a frequency multiplier circuit configured to adjust a frequency of the amplified intermediate clock to generate a frequency-multiplied signal; and
   a second frequency divider configured to divide the frequency-multiplied signal to generate the first reference clock and the second reference clock.

3. The phase-locked loop circuit according to claim 2, wherein the integrator is coupled to the DC offset amplifier and the DC control circuit, and is configured to generate the first control signal according to the first reference clock and the second reference clock, wherein the first control signal changes with an average component of a duty ratio of the first reference clock and the second reference clock.

4. The phase-locked loop circuit according to claim 1, wherein the first sub-sampling phase detection circuit includes:
   a first sub-sampling phase detector configured to sample the output clock with the second reference clock, and convert a phase error between the second reference clock and the output clock to output a first charge pump control signal pair; and
   a first charge pump configured to generate the second control signal according to the first charge pump control signal pair.

5. The phase-locked loop circuit according to claim 1, wherein the second sub-sampling phase detection circuit includes:
   a second sub-sampling phase detector configured to sample the output clock with the first reference clock, and convert a phase error between the first reference clock and the output clock to output a second charge pump control signal pair; and
   a second charge pump configured to generate the third control signal according to the second charge pump control signal pair.

6. The phase-locked loop circuit according to claim 5, wherein the sub-sampling phase-locked loop further includes a second low-pass filter configured to filter the third control signal and the fourth control signal to generate a second filtered signal,
   wherein the voltage-controlled oscillator is configured to generate the output clock according to the second filtered signal.

7. The phase-locked loop circuit according to claim 1, wherein the phase frequency detection circuit includes:
   a phase frequency detector configured to receive the first output clock and the frequency-divided signal, wherein in response to the phase error between the first output clock and the frequency-divided signal being greater than the predetermined dead time, the phase frequency detector is configured to generate a third charge pump control signal pair; and
   a third charge pump configured to generate the fourth control signal according to the third charge pump control signal pair.

8. The phase-locked loop circuit according to claim 7, wherein the phase frequency detector includes:
   a first flip-flop configured to receive a first delay signal associated with the first reference clock, a system voltage signal and a first reset signal to output a first output signal;
   a second flip-flop configured to receive a second delay signal associated with the frequency-divided signal, the system voltage signal and the first reset signal to output a second output signal;
   a third flip-flop configured to receive the first delay signal, the system voltage signal and a second reset signal to output a third output signal;
   a fourth flip-flop configured to receive the second delay signal, the system voltage signal and a third reset signal to output a fourth output signal;
   a first delay circuit configured to delay the first output signal by the predetermined dead time to generate a third delay signal;
   a second delay circuit configured to delay the second output signal by the predetermined dead time to generate a fourth delay signal;
   a first logic gate configured to receive the third output signal and the third delay signal to perform a logic operation to generate a fifth control signal; and
   a second logic gate configured to receive the fourth output signal and the fourth delay signal to perform another logic operation to generate a sixth control signal,
   wherein the fifth control signal and the sixth control signal are used as the third charge pump control signal pair.

9. The phase-locked loop circuit according to claim 8, wherein the phase frequency detector further includes:
   a first delay element configured to delay the first reference clock to generate the first delay signal; and
   a second delay element configured to delay the frequency-divided signal to generate the second delay signal.

10. The phase-locked loop circuit according to claim 8, wherein the second reset signal is used as the first reference clock, and the third reset signal is used as the frequency-divided signal.

11. The phase-locked loop circuit according to claim 8, wherein the phase frequency detector further includes:
    a second logic gate configured to receive the first output signal and the second output signal to perform another logic operation to generate a seventh control signal; and
    a third delay circuit configured to delay the seventh control signal by the predetermined dead time to generate the first reset signal.

12. The phase-locked loop circuit according claim 8, wherein the first delay circuit, the second delay circuit and the third delay circuit have the same adjustable delay units.

13. The phase-locked loop circuit according to claim 8, wherein the phase frequency detector further includes:
    a first inverter circuit disposed between the third flip-flop and the second logic gate; and
    a second inverter circuit disposed between the fourth flip-flop and the first logic gate.

14. The phase-locked loop circuit according to claim 13, wherein the first delay circuit includes:
    a third inverter circuit including two inverters; and
    a first adjustable delay unit.

15. The phase-locked loop circuit according to claim 14, wherein the second delay circuit includes:
    a fourth inverter circuit including two inverters; and
    a second adjustable delay unit being the same as the first adjustable delay unit.

* * * * *